(12) United States Patent
Heilbronner

(10) Patent No.: US 6,831,359 B2
(45) Date of Patent: Dec. 14, 2004

(54) POWER SEMICONDUCTOR MODULE

(75) Inventor: Heinrich Heilbronner, Stein (DE)

(73) Assignee: Semikron Elektronik GmbH, Nuremberg (DE)

(*) Notice: Subject to any disclaimer, the term of this patent is extended or adjusted under 35 U.S.C. 154(b) by 0 days.

(21) Appl. No.: 10/684,310

(22) Filed: Oct. 11, 2003

(65) Prior Publication Data
US 2004/0108589 A1 Jun. 10, 2004

(30) Foreign Application Priority Data

Oct. 18, 2002 (DE) ........................................ 102 48 644

(51) Int. Cl.[7] .............................................. H01L 23/34
(52) U.S. Cl. ...................................... 257/720; 257/706
(58) Field of Search ................................ 257/720, 706

(56) References Cited

U.S. PATENT DOCUMENTS 6,625,025 B1 * 9/2003 Duxbury et al. ............ 361/704

FOREIGN PATENT DOCUMENTS

| DE | 19648562 A1 | 5/1998 |
|---|---|---|
| DE | 19903875 A1 | 8/2000 |
| DE | 19648562 C2 | 2/2001 |
| DE | 19903875 C2 | 11/2001 |
| DE | 10103340 A1 | 8/2002 |
| DE | 10129170 A1 | 12/2002 |

* cited by examiner

Primary Examiner—David Nelms
Assistant Examiner—Tu-Tu Ho
(74) Attorney, Agent, or Firm—Andrew F. Young, P.C.

(57) ABSTRACT

The invention relates to a power semiconductor module, in particular a power converter module, with a base plate or for direct installation on a heat sink or other cooling body or means for cooling. The power semiconductor module includes, at least one power semiconductor component, and at least one insulating substrate on whose first surface a metallic layer is provided. A carbon-based layer (including Carbon nano-tubes) is used for at least one of a thermal and a partly electrical contacting, on at least one of the one side for contacting the power semiconductor component with the metallic layer and, (in an alternate embodiment) on the other side to connect the substrate with the heat sink or cooling body.

26 Claims, 2 Drawing Sheets

POWER SEMICONDUCTOR MODULE

This application claims foreign priority from DE 102 48 644.1, filed Oct. 13, 2002, the contents of which are incorporated herein by reference.

SELECTED FIGURE FOR PUBLICATION

FIG. 1 is selected for publication on the face of the face of the patent.

BACKGROUND OF THE INVENTION

1. Field of the Invention

The present invention relates to a power semiconductor module having improved configuration technology. More specifically, the present invention relates to a power semiconductor module with a base plate and/or being configured for direct or indirect installation on a heat sink or other cooling body, with active and/or passive components and improved configuration and electro-conductive features.

2. Description of the Related Art

Power semiconductor modules, in particular those including a power converter module, are known to have a base plate or for direct installation on a heat sink, with active and/or passive components. Several such power semiconductor modules are known from the literature. When the capacity is increased, especially by using modern power semiconductor components with higher cooling requirements, the conventional art cannot meet these requirements. Consequently, the present invention provides other methods of configuration technology that are absolutely necessary for the individual parts.

Modern power semiconductor modules, which are the starting point of this invention, are modules without base plates, such as described in DE 199 03 875 C2, the contents of which are herein incorporated by reference, consisting of:
- a packaging,
- a ceramic substrate with circuit-friendly metallic laminations such as those made according to the DCB (direct copper bonding) method;
- components positively bonded to this substrate by soldering, such as diodes, transistors, resistors or sensors;
- bonds to connect the structured side of the components with other components, the substrate and/or connecting elements leading outside;
- a sealing compound preferably made of silicon rubber, to insulate the individual components from each other.

A configuration technology with pressure contact for the thermal contacting of the module on a heat sink has proven very advantageous for such power semiconductor modules. Unfortunately, this pressure contact configuration technology has been shown in particular, that the quality of large-surface soldering bonds is very difficult to control, which is greatly detrimental to the reliability and service life (premature failure) of the power semiconductor modules. This type of pressure contact bond has uniformity, homogeneity, and substantial quality control problems that increase greatly with the areas being pressure-contact-bonded.

Preferably, the pressure configuration in such pressure-contacted power semiconductor modules is achieved with a mechanically stable pressure plate. Depending on the further development, the generated pressure can be transmitted to the substrate either by means of special pressure plate designs (as shown, for example, in DE 196 48 562 C2) or by means of an elastic pressure accumulator according to DE 199 03 875 C2, the contents of both references are herein incorporated by reference as background material.

In such pressure-contacted power semiconductor modules, a heat-conducting medium is provided in an effort to establish full-surface thermal conduct and thus to compensate for any unevenness or non-uniformity on the heat sink and/or the substrate underside between the power semiconductor module and the heat sink. The non-uniformity of surface between the two opposing surfaces for pressure contacting can magnify the difficulties where any defects are complementary and additive.

In the power semiconductor modules according to DE 196 48 562 C2 or DE 199 03 875 C2, as well as power semiconductor modules known in prior art, with a base plate or for direct installation on a heat sink, each has the distinct disadvantage that heat dissipation to a cooling element, such as a heat sink, is subject to high thermal resistance, or thermal resistivity (the inverse of thermal conductivity). The more marginal areas exist between the power semiconductor module generating the heat and the heat sink, the greater the thermal transfer resistance. In comparison with metals, flexible thermally conducting layers such as heat-conductive paste, have clearly higher heat resistance. Therefore, the efficient dissipation of heat from a power semiconductor module to a heat sink is a substantial component of highly efficient compact configuration topologies.

Another disadvantage of conventional power semiconductor modules with a base plate or designed for direct installation on a heat sink is that modern power semiconductor components, as commonly used, have a higher current load capacity per relative chip area and consequently produce much more waste heat per unit of area. Unfortunately, the thermal connection between an advantageously metal-laminated substrate and the power semiconductor component is already a limiting factor for the efficiency of a power semiconductor module. At present, the heat generated in the power semiconductor component can still be dissipated by means of existing connection methods, usually soldering bonds.

In considering future chip generations, the thermal conductivity of the connection between the power semiconductor component and the substrate, will have an even more limiting effect on efficiency. Furthermore, the connections named above are presently at the limit of their current load capacity. In that respect, too, the electrical connection between the power semiconductor component and the substrate will determine the efficiency of the power semiconductor module In summary, the problems with commercially available power semiconductor modules include at least the following:

1. Incapable thermal conductivity between semiconductor components and a substrate and/or a substrate and a heat sink or cooling body or means for cooling.
2. Non-uniform pressure contacting and non-uniform bonding resulting in the potential for hot-spots and weak-spots where the pressure contact bonding is insecure or non-uniform.
3. The electrical load capacity of present designs is limited by the pressure contact bonding between components.
4. Difficulty in uniformly forming a pressure contact bond between a metal-laminated surface of a substrate with either a power semiconductor component and/or a heat sink, cooling body, or other means for cooling and further transmitting any received thermal energy.

OBJECTS AND SUMMARY OF THE INVENTION

Another object of the present invention is to provide a power semiconductor module that overcomes the disadvantages noted above.

It is another object of the present invention is to provide a power semiconductor module with improved cooling ability while retaining module strength and electroconductive characteristics.

It is another object of the present invention to provide an improved uniformity of a thermal bond between a substrate and a power semiconductor component.

It is another object of the present invention is to present a power semiconductor module in which the electrically and thermally conductive connection between at least one power semiconductor component and a substrate and/or the thermally conductive connection with a heat sink or cooling body or other means for cooling the power semiconductor module that has a reduced thermal and optionally also electrical resistance.

It is a further object of the present invention to present a power semiconductor module easily adapted in multiple embodiments beyond those shown herein as along as the invention, as described herein, is embodied.

It is another object of the present invention to create a thermally conductive paste including carbon based tubules resulting in a thermally conductive paste with better thermal conductivity than the prior art by at least about two orders of magnitude.

The present invention relates to a power semiconductor module, in particular a power converter module, with a base plate or for direct installation on a heat sink, cooling body, or other means for thermally cooling. The power semiconductor module consists of generally a packaging (not shown), at least one power semiconductor component and at least one insulating substrate on whose first surface a metallic layer is provided. Additional items and components may be optionally added to the present power semiconductor module as needed to meet the needs of any circuit design without departing from the teachings herein. Carbon nano tubules (having a very small size) are used for at least one of a thermal and partly electrical contacting, on at least one of the top side and a bottom side of a substrate for contacting the power semiconductor component with the metallic layer and on the other side to connect the substrate with the heat sink or cooling body.

According to one embodiment of the present invention there is provided a power semiconductor module, comprising: at least one thermally conducting supporting member, at least one power semiconductor component, t least one insulating substrate having a first surface between the power semiconductor component and the substrate, a metallic layer on the first surface, and at least a first thermal conduction layer comprising at least a plurality of carbon based tubules between the metallic layer on the first surface and the power semiconductor component, whereby a thermal conductivity is improved.

According to another embodiment of the present invention, there is further provided a power semiconductor module, wherein: the supporting member includes at least one of a base plate, a heat sink, a cooling member, and a means for transferring thermal energy away from the substrate and the at least one power semiconductor component.

According to another embodiment of the present invention, there is further provided a power semiconductor module, further comprising: a packaging in the power semiconductor module, and the packaging at least partially bounding the power semiconductor module, whereby the packaging aids an assembly and a use of the power semiconductor module.

According to another embodiment of the present invention, there is further provided a power semiconductor module, wherein: the carbon-based tubules are arranged substantially orthogonal to the plane of the substrate.

According to another embodiment of the present invention, there is further provided a power semiconductor module, further comprising: at least a second surface on the insulating substrate between the substrate and the thermally conducting support member, and at least a second thermal conduction layer comprising a plurality of carbon based tubules between the second surface and the support member, whereby a thermal conductivity is improved.

According to another embodiment of the present invention, there is further provided a power semiconductor module, wherein: the plurality of tubules in the first layer extends substantially orthogonal to the substrate.

According to another embodiment of the present invention, there is further provided a power semiconductor module, wherein: the plurality of tubules in the first and the second layers extends substantially orthogonal to the substrate.

According to another embodiment of the present invention, there is further provided a power semiconductor module, further comprising: at least a second surface on the substrate, opposite the first surface, a second metallic layer on the second surface, at least a second thermal conduction layer comprising a plurality of carbon based tubules between the second metallic layer and the supporting member.

According to another embodiment of the present invention, there is further provided a power semiconductor module, wherein: the carbon-based tubules include at least a plurality of carbon-nano tubules.

According to another embodiment of the present invention, there is further provided a power semiconductor module, wherein: the at least one power semiconductor component and the first thermal conduction layer are positively bonded to the substrate by means of a pressure contact.

According to another embodiment of the present invention, there is further provided a power semiconductor module, wherein: the second conduction layer is a pasty mixture comprising the plurality of carbon based tubular members and a bonding agent, whereby the pasty mixture forms a conductive past.

According to another embodiment of the present invention, there is further provided a power semiconductor module, wherein: the power semiconductor module is arranged on the conducting supporting member by a means for applying a pressure contact.

According to another embodiment of the present invention, there is further provided a power semiconductor module, further comprising: a second thermal conductive layer between the substrate and the supporting member, and the second layer being a pasty mixture comprising at least a plurality of carbon based tubules and a bonding agent.

According to another embodiment of the present invention, there is further provided a power semiconductor module, wherein: a thermal conductivity of the pasty mixture is about two orders of magnitude less thermally conductive than a conventional pasty mixture.

According to another embodiment of the present invention, there is further provided a power semiconductor module, comprising: at least one means for thermally conducting and supporting the power semiconductor module, at least one power semiconductor component, at least one insulating substrate having a first surface between the power semiconductor component and the substrate, a metallic layer on the first surface, at least a first thermally conduction layer including at least a plurality of carbon based tubules between the metallic layer on the first surface and the power semiconductor component, and at least a second thermally conduction layer including at least a plurality of carbon based tubules between the insulating substrate and the means for thermally conducting and supporting, whereby a thermal conductivity from the power semiconductor component to the means for thermally conducting and supporting is greatly improved.

According to another embodiment of the present invention, there is further provided a power semiconductor module, further comprising: at least a first metallic layer on a first side of the substrate, between the fist thermally conductive layer and the substrate, and at least a second metallic layer on a second side of the substrate, between the second thermally conductive layer and the substrate, whereby a thermal conductivity of the module is increased.

According to another embodiment of the present invention, there is provided a method for manufacturing a power semiconductor module, comprising the steps of: forming a first metallic layer on a top surface of a substrate, forming a first thermally conductive layer between one of a bottom surface of a power semiconductor component and the first metallic layer, the first thermally conductive layer including a plurality of carbon based tubules, positively bonding the power semiconductor component and the first thermally conductive layer on the first metallic layer of the substrate, forming a second thermally conductive layer between one of a bottom surface of the substrate and a top surface of a thermally conducting support member, positively bonding the second substrate and the second thermally conductive layer to the support member, whereby a power semiconductor module is formed having a very easy thermal conductivity from the power semiconductor component to the support member.

According to another embodiment of the present invention there is provided a power semiconductor module, comprising: at least one power semiconductor component, at least one substrate, at least one metallic layer on at least a first surface of the substrate, at least one thermally conducting support member, at least one thermally conducting layer between at least one of the power semiconductor component and the substrate, and the substrate and the support member, and the at least one thermally conducting layer including a plurality of carbon based tubular components, whereby a thermal conductivity of the power semiconductor module is increased.

According to another embodiment of the present invention, there is provided a power semiconductor module, with a base plate or for direct installation on a heat sink, comprising: packaging surrounding at least a portion of the module, at least one power semiconductor component, at least one insulating substrate on whose first surface a metallic layer is provided, whereby the at least one power semiconductor component is connected with the metallic layer by means of a layer containing carbon nano tubules running substantially orthogonal to the substrate planes, whereby the substrate is additionally connected with one of the base plate and the heat sink by means of a layer of carbon nano tubules.

According to another embodiment of the present invention, there is further provided a power semiconductor module, wherein: an additional metallic layer is provided on the second main surface between the substrate and the layer of carbon nano tubules.

According to another embodiment of the present invention, there is further provided a power semiconductor module, wherein: the at least one power semiconductor component including its carbon nano tubules is positively bonded to the substrate by means of a pressure contact.

According to another embodiment of the present invention, there is further provided a power semiconductor module, wherein: the power semiconductor module is arranged on the base plate or the heat sink by means of pressure contact.

According to another embodiment of the present invention, there is further provided a power semiconductor module, wherein: the carbon nano tubules are arranged directly on the power semiconductor component.

According to another embodiment of the present invention, there is further provided a power semiconductor module, wherein: the carbon nano tubules are arranged on at least one metallic layer of the substrate.

According to another embodiment of the present invention, there is further provided a power semiconductor module, wherein: the carbon nano tubules are arranged substantially orthogonal to a substrate plane.

According to another embodiment of the present invention, there is further provided a power semiconductor module, wherein: the carbon nano tubules are arranged between the substrate and the base plate or the heat sink in a pasty mixture of carbon nano tubules and a bonding agent, selected from a group including a silicon oil.

The above, and other objects, features and advantages of the present invention will become apparent from the following description read in conduction with the accompanying drawings, in which like reference numerals designate the same elements.

DETAILED DESCRIPTION OF THE PREFERRED EMBODIMENTS

Figure 1:
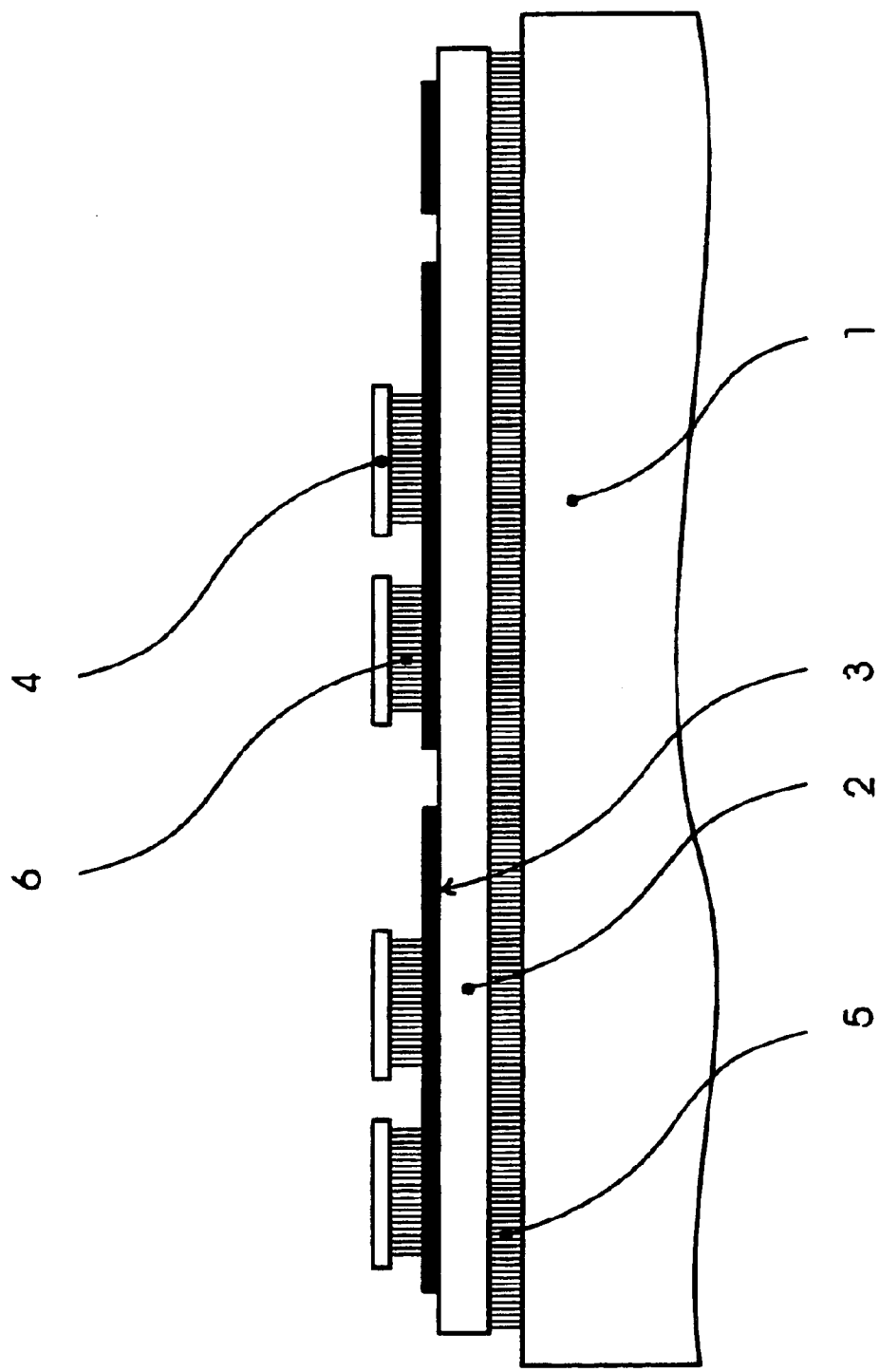
FIG. 1 is a side view of one embodiment of the present invention.

In coping with the problems noted above, the present invention provides a power semiconductor module in which the electrically and thermally conductive connection is improved between at least one power semiconductor component (multiple types) and at least one of the substrate and/or the thermally conductive connection with a heat sink or cooling device or body, resulting in a strong and thermally conductive bond, reduced thermal resistance/resistivity, and where desired electrical resistance depending upon a designer's need to reduce an electrical resistance.

Carbon nano tubules are electrically and highly thermally conductive materials, as known from many research studies and, for example, from DE 101 03 340 A1, the contents of which are herein incorporated by reference. It is also known that such carbon nano tubules are preferably formed running in the direction of the tube. In this preferred direction, the carbon nano tubules (if properly designed) have a lower thermal and electrical resistance than metals.

The basic concept of the invention is the use of such carbon nano tubules as thermally conductive and/or thermally and electrically conductive components within a power semiconductor module and/or from a power semiconductor module to a heat sink or other cooling body.

The power semiconductor module according to the invention, with a base plate or directly installed on a heat sink, includes optionally a packaging (not shown), at least one electrically and thermally contacted power semiconductor component and at least one insulating layer, as will be described. The packaging is optional to the present invention depending upon various preferred designs possible to a customer.

On the first surface of the substrate facing away from the base plate or the heat sink/cooling body, a metallic layer is provided which preferably has a circuit-friendly structure (i.e. circuit capable or circuit receptive or capable of being joined in a circuit), and on which at least one power semiconductor module is arranged. A layer of carbon nano tubules, in a preferred embodiment running substantially orthogonal to the substrate planes, is provided as an electrically and thermally conductive connection between the power semiconductor component and the metallic layer. Alternative alignments, both homogenous and amorphous are also envisioned in alternative embodiments of the present invention. It should be understood that the preferred embodiment noted above is one of many inventive embodiments incorporating the present inventive aspects disclosed.

Alternatively or as a supplement, the power semiconductor module according to the invention has another layer (a second layer, or even a third or fourth layer depending upon multiple construction options including to the present invention) of carbon-based layer (including the commonly known carbon-nano-tubes, or more generally a carbon-based tubular layer) that is arranged between the substrate and a heat sink, a cooling element or a base plate. This carbon-based layer has a similar high thermal conductivity and may optionally be oriented in as manner, including a substantially orthogonal manner to the support plane, as selected by a designer. This additional layer may or may not employ an additional metal layer or other element or layer between the substrate and the heat sink or cooling element.

Figure 2:
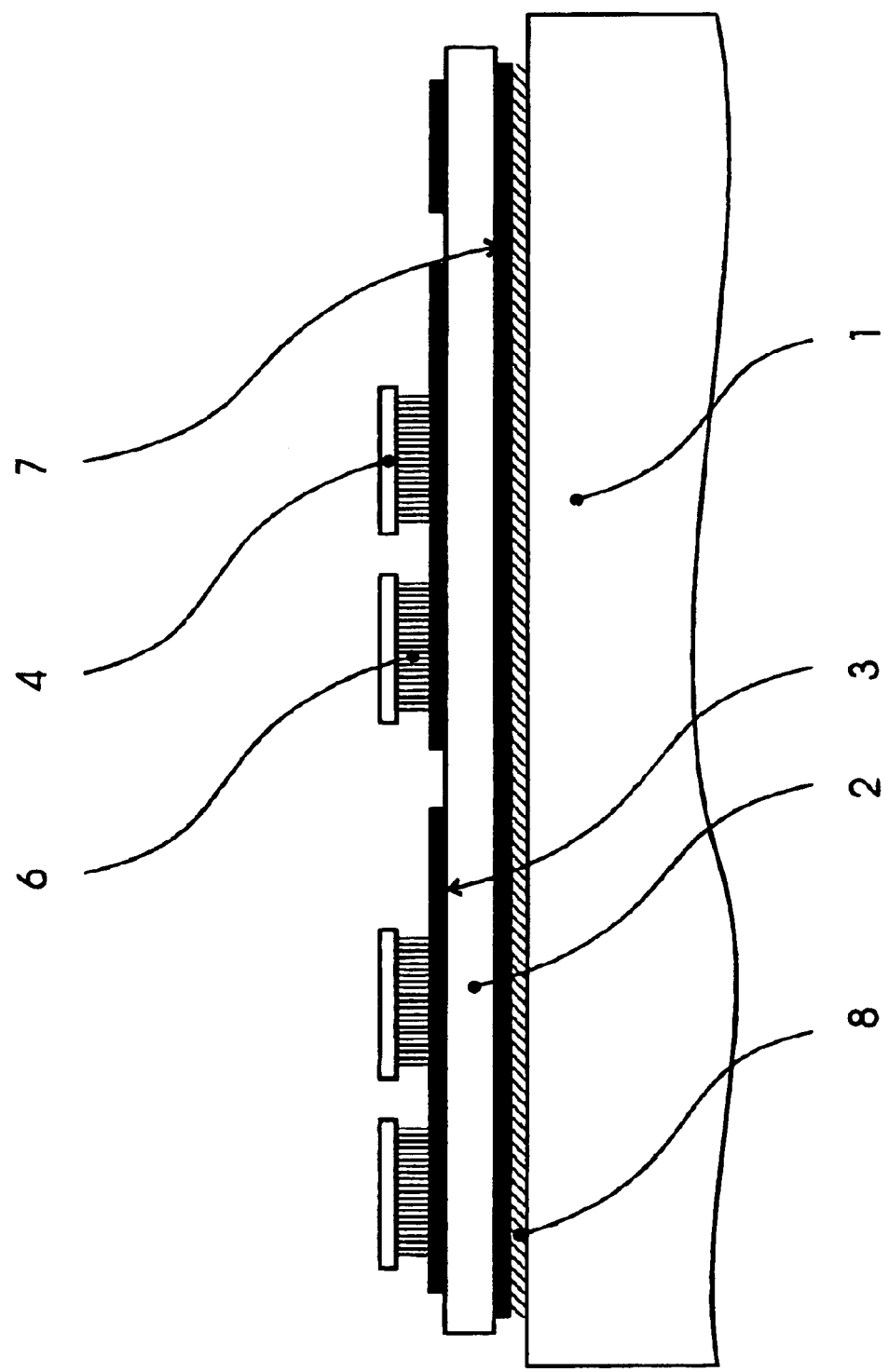
FIG. 2 is a side view of another embodiment of the present invention.

Referring now to selected embodiments of the present invention, selectively shown in FIGS. 1 and 2. It should be understood, that for the sake of simplicity, the packaging and any conventionally known connections between the top surfaces of the components and the metallic layers, as well as the further connecting elements are not shown so that the positioning of the elements in the present invention may be more clearly understood. It should be recognized that the present invention envisions, and is capable of employing and incorporating multiple conventional connections/components/packaging embodiments employing the benefits of the present invention.

The figures show a cross section through a power semiconductor module with inventive characteristics in a configuration with a thermally conductive support member, specifically a heat sink or cooling body or means for cooling (1) and/or a base plate (1). For that reason, the terms "support member" "base plate," "heat sink," and "cooling body" or "means for cooling" are used synonymously below.

A heat sink/cooling member/means for cooling 1 is thermally conductively connected with an insulating substrate 2 by means of a layer of carbon based tubules 5 running, in the present embodiment, substantially orthogonal to the heat sink surface and epitaxially deposited on the heat sink. The layer of carbon based nano tubules may alternatively or additionally, be epitaxially deposited (or another selected orientation in alternative embodiments) on substrate 2. For this purpose, it is advantageous to provide substrate 2 with a metallic layer 7 (copper, copper alloy, nickel, or other non-ferrous based layer) on its side facing the heat sink 1. Conductive and bonding layer 7, as well as the metallic layer 3, (in singular or multiple layers) can be applied on the side of the substrate 2 facing away from the heat sink 1 or any other side, for example by means of the known DCB method. In an alternative embodiment, it can be advantageous if between the thus resulting metallic layer and the layer of carbon based tubules another layer (thinner than the copper layer) of another metal, preferably nickel, is arranged as bonding agent for the carbon based nano tubules, other bonding agents are also envisioned, as will be described.

The carbon nano tubules are applied to the respective surfaces by means of known methods, such as that described in DE 101 03 340 A1, herein incorporated by reference, or in other envisioned methods allowing a preferred orientation of the carbon-based tubules.

Power semiconductor components 4 are arranged on the side of the substrate 2 that faces away from heat sink 1. On the side facing substrate 2 they are provided with a layer of carbon based nano tubules 6 directly epitaxially deposited on the power semiconductor component 4. It is envisioned in alternative embodiments of the present invention that a beneficial ceramic, a metallic, or a cera-metalic bonding layer may be deposited on power semiconductor components 4 prior to deposition of the carbon based tubules 6.

Safe contacting of the power semiconductor components 4 on the metallic layer 3 is achieved by means of pressure-bonded contact (not shown). For this purpose, pressure is exerted on the top side of the power semiconductor component 4 by means of a suitable pressure element (also not shown). Advantageously, an electrical contact can be achieved in this manner as well. Such a pressure contacting method is known, for example, from DE 101 29 170 A1, the contents of which are incorporated as a reference.

The entire power semiconductor module is also pressed onto heat sink/cooling body 1 by means of pressure-bonded contact (not shown), for example according to DE 101 29 170 A1, the contents of which are incorporated as a reference, and are thus thermally conductively connected with same.

An alternative embodiment of the present invention, and of the thermally conductive connection between the substrate 2 and heat sink/cooling body 1, is shown in FIG. 2. In FIG. 2, the carbon nano tubules are not arranged in a combined bond as described above, but are embedded in a bonding agent 8 such as a silicon oil (AKF 1000 by Wacker) as individual tubules, groups, or assemblies of tubules. This pasty mixture 8 (containing a bonding agent and the carbon based tubules) is applied between the substrate 2 and the heat sink 1 in the same manner as customary heat-conductive pastes known in prior art. One advantage of this embodiment according to the present invention, is that this pasty mixture 8 is less thermally conductive than the prior art by at least about 2 orders of magnitude.

It should be understood by those reading the above that the use of the phrase heat sink is synonymous with a cooling body or means for thermal transfer away from the substrate in order to cool or control a temperature of the power semiconductor components and any accompanying circuitry.

It should be understood, that the use of the descriptive language 'tubules' herein encompasses not only those members having an atomic cylindraceious construct, but those having simply a generally elongated atomic structure. Consequently it is not necessary for the carbon based members to be tubules but they shall be understood as carbon based members.

It should be additionally understood, that the description of carbon based tubules herein shall include carbon-nano tubes, where the tubes solely contain carbon atoms, and being capable of description in nanometers, micrometers, or meters (i.e. $1 \times 10-3^{-3-3 \text{ or } -6 \text{ or } -9}$ meters depending upon the size lead integer used). For example, it should be understood that micrometers (um) and nanometers (nm) are easily cross-converted and may be interchangeably used to describe a generally very small, elongated set of carbon atoms. It should be further understood, that the carbon-based tubules may include, intentionally or unintentionally, inorganic or other impurities in addition to the C (carbon) atoms described. It should be further understood, that the use of the phrase 'nano' or 'micro', while a general description link to convenient size, is not required as a limitation were a manufacturer may grow the carbon based tubules to any useful size, including the um/nm/mm size (most often in the $1 \times 10^{-6 \, to-9}$ size range) or in any other size effective to position the tubules as shown to maintain a high thermal conductivity and a low or otherwise controlled electrical conductivity (if any).

It should also be recognized that while epitaxial growth (growth in a direction mimicking the orientation of a supportive growth base/substrate i.e. substantially orthogonal or parallel) is most common, other non-orthogonal/parallel or slanted orientations are envisioned as may exist in the art of growing carbonaceous nano tubules (i.e.

As a result of the present invention it should be readily understood by those skilled in the art that a thermal conductivity and contact between the components is increased substantially, sufficient to overcome the detriments in the conventional art noted above, while allowing an increasing compaction of the overall semiconductor module and reduction is size. It should also be readily recognized by those skilled in the art that employing the present invention improves the easily quality control of power semiconductor module manufacture and a corresponding increase in useful component life span by retaining or reducing an operating temperature. It is envisioned in alternative embodiments, that alternative means for securing the components together include the use of deposited thermally conductive ceramic thin films linking directly a selected component to the carbon based tubular members.

Although only a single or few exemplary embodiments of this invention have been described in detail above, those skilled in the art will readily appreciate that many modifications are possible in the exemplary embodiment(s) without materially departing from the novel teachings and advantages of this invention. Accordingly, all such modifications are intended to be included within the spirit and scope of this invention as defined in the following claims.

In the claims, means- or step-plus-function clauses are intended to cover the structures described or suggested herein as performing the recited function and not only structural equivalents but also equivalent structures. Thus, for example, although a nail, a screw, and a bolt may not be structural equivalents in that a nail relies entirely on friction between a wooden part and a cylindrical surface, a screw's helical surface positively engages the wooden part, and a bolts head and nut compress opposite sides of at least one wooden part, in the environment of fastening, a nail, a screw, and a bolt may be readily understood by those skilled in the art as equivalent structures.

Having described at least one of the preferred embodiments of the present invention with reference to the accompanying drawings, it is to be understood that the invention is not limited to those precise embodiments, and that various changes, modifications, and adaptations may be effected therein by one skilled in the art without departing from the scope or spirit of the invention as defined in the appended claims.

What is claimed is:

1. A power semiconductor module, comprising:
   at least one thermally conducting supporting member;
   at least one power semiconductor component;
   at least one insulating substrate having a first surface between said power semiconductor component and said substrate;
   a metallic layer on said first surface; and
   at least a first thermal conduction layer comprising at least a plurality of carbon based tubules between said metallic layer on said first surface and said power semiconductor component, whereby a thermal conductivity is improved.

2. A power semiconductor module, according to claim 1, wherein:
   said supporting member includes at least one of a base plate, a heat sink, a cooling member, and a means for transferring thermal energy away from said substrate and said at least one power semiconductor component.

3. A power semiconductor module, according to claim 1, further comprising:
   a packaging in said power semiconductor module; and
   said packaging at least partially bounding said power semiconductor module, whereby said packaging aids an assembly and a use of said power semiconductor module.

4. A power semiconductor module, according to claim 1, wherein:
   said carbon based tubules are arranged substantially orthogonal to the plane of said substrate.

5. A power semiconductor module, according to claim 1, further comprising:
   at least a second surface on said insulating substrate between said substrate and said thermally conducting support member; and
   at least a second thermal conduction layer comprising a plurality of carbon based tubules between said second surface and said support member, whereby a thermal conductivity is improved.

6. A power semiconductor module, according to claim 1, wherein:
   said plurality of tubules in said first layer extends substantially orthogonal to said substrate.

7. A power semiconductor module, according to claim 5, wherein:
   said plurality of tubules in said first and said second layers extends substantially orthogonal to said substrate.

8. A power semiconductor module, according to claim 1, further comprising:
   at least a second surface on said substrate, opposite said first surface;
   a second metallic layer on said second surface;
   at least a second thermal conduction layer comprising a plurality of carbon based tubules between said second metallic layer and said supporting member.

9. A power semiconductor module, according to claim 1, wherein:

said carbon based tubules include at least a plurality of carbon-nano tubules.

10. A power semiconductor module, according to claim 1, wherein:

said at least one power semiconductor component and said first thermal conduction layer are positively bonded to said substrate by means of a pressure contact.

11. A power semiconductor module, according to claim 5, wherein:

said second conduction layer is a pasty mixture comprising at least said plurality of carbon based tubular members and a bonding agent, whereby said pasty mixture forms a conductive past.

12. A power semiconductor module, according to claim 1, wherein:

said power semiconductor module is arranged on said conducting supporting member by a means for applying a pressure contact.

13. A power semiconductor module, according to claim 1, further comprising:

a second thermal conductive layer between said substrate and said supporting member; and said second layer being a pasty mixture comprising at least a plurality of carbon based tubules and a bonding agent.

14. A power semiconductor module, according to claim 11, wherein:

a thermal conductivity of said pasty mixture is about two orders of magnitude less thermally conductive than a conventional pasty mixture.

15. A power semiconductor module, comprising:

at least one means for thermally conducting and supporting said power semiconductor module;

at least one power semiconductor component;

at least one insulating substrate having a first surface between said power semiconductor component and said substrate;

a metallic layer on said first surface;

at least a first thermally conduction layer including at least a plurality of carbon based tubules between said metallic layer on said first surface and said power semiconductor component; and at least a second thermally conduction layer including at least a plurality of carbon based tubules between said insulating substrate and said means for thermally conducting and supporting, whereby a thermal conductivity from said power semiconductor component to said means for thermally conducting and supporting is greatly improved.

16. A power semiconductor module, according to claim 15, further comprising:

at least a first metallic layer on a first side of said substrate, between said fist thermally conductive layer and said substrate; and at least a second metallic layer on a second side of said substrate, between said second thermally conductive layer and said substrate, whereby a thermal conductivity of said module is increased.

17. A method for manufacturing a power semiconductor module, comprising the steps of:

forming a first metallic layer on a top surface of a substrate;

forming a first thermally conductive layer between one of a bottom surface of a power semiconductor component and said first metallic layer;

said first thermally conductive layer including a plurality of carbon based tubules;

positively bonding said power semiconductor component and said first thermally conductive layer on said first metallic layer of said substrate;

forming a second thermally conductive layer between one of a bottom surface of said substrate and a top surface of a thermally conducting support member;

positively bonding said second substrate and said second thermally conductive layer to said support member, whereby a power semiconductor module is formed having a very easy thermal conductivity from said power semiconductor component to said support member.

18. A power semiconductor module, comprising:

at least one power semiconductor component;

at least one substrate;

at least one metallic layer on at least a first surface of said substrate;

at least one thermally conducting support member;

at least one thermally conducting layer between at least one of said power semiconductor component and said substrate, and said substrate and said support member; and said at least one thermally conducting layer including a plurality of carbon based tubular components, whereby a thermal conductivity of said power semiconductor module is increased.

19. A power semiconductor module, with a base plate or for direct installation on a heat sink, comprising:

a packaging surrounding at least a portion of said module;

at least one power semiconductor component;

at least one insulating substrate on whose first surface a metallic layer is provided, whereby the at least one power semiconductor component is connected with said metallic layer by means of a layer containing carbon nano tubules running substantially orthogonal to the substrate planes, whereby said substrate is additionally connected with one of said base plate and said heat sink by means of a layer of carbon nano tubules.

20. A power semiconductor module, according to claim 19, wherein:

in that an additional metallic layer is provided on the second main surface between the substrate and the layer of carbon nano tubules.

21. A power semiconductor module according to claim 19, wherein:

the at least one power semiconductor component including its carbon nano tubules is positively bonded to the substrate by means of a pressure contact.

22. A power semiconductor module according to claim 19, wherein:

the power semiconductor module is arranged on the base plate or the heat sink by means of pressure contact.

23. A power semiconductor module according to claim 19, wherein:

the carbon nano tubules are arranged directly on the power semiconductor component.

24. A power semiconductor module according to claim 19, wherein:

the carbon nano tubules are arranged on at least one metallic layer of the substrate.

25. A power semiconductor module, according to claim 19, wherein:
the carbon nano tubules are arranged substantially orthogonal to a substrate plane.

26. A power semiconductor module, according to claim 19, wherein:
the carbon nano tubules are arranged between the substrate and the base plate or the heat sink in a pasty mixture of carbon nano tubules and a bonding agent, selected from a group including a silicon oil.

* * * * *